US012751325B2

(12) United States Patent
Zhang et al.

(10) Patent No.: US 12,751,325 B2
(45) Date of Patent: Sep. 29, 2026

(54) DATA AND SCANNING LINES PATTERN OF AN LED PANEL STRUCTURE

(71) Applicant: Jiangxi MTC Visual Display Co., Ltd, Nanchang (CN)

(72) Inventors: Haibo Zhang, Shenzhen (CN); Shengbin He, Shenzhen (CN); Wei Gu, Shenzhen (CN)

(73) Assignee: Jiangxi MTC Visual Display Co., Ltd, Nanchang (CN)

( * ) Notice: Subject to any disclaimer, the term of this patent is extended or adjusted under 35 U.S.C. 154(b) by 371 days.

(21) Appl. No.: 18/221,277

(22) Filed: Jul. 12, 2023

(65) Prior Publication Data

US 2024/0014186 A1 Jan. 11, 2024

Related U.S. Application Data

(63) Continuation of application No. PCT/CN2022/110048, filed on Aug. 3, 2022.

(30) Foreign Application Priority Data

Jul. 5, 2022 (CN) ......................... 202210792752.0

(51) Int. Cl.
*H10W 90/00* (2026.01)

(52) U.S. Cl.
CPC .................................. *H10W 90/00* (2026.01)

(58) Field of Classification Search
CPC .. H01L 25/0753; H10H 29/49; H05K 1/0298; H05K 2201/10106; H05K 2201/09409; H05K 1/114; H05K 1/0289; G09F 9/33
See application file for complete search history.

(56) References Cited

U.S. PATENT DOCUMENTS

2011/0080434 A1* 4/2011 Tagawa ................ G09G 3/3291 345/83
2014/0008674 A1 1/2014 Watanabe et al.
(Continued)

FOREIGN PATENT DOCUMENTS

CN 106201143 A 12/2016
CN 109298577 A 2/2019
(Continued)

OTHER PUBLICATIONS

PCT Search Report for International Application No. PCT/CN2022/110048, mailed Apr. 5, 2023, 4 pp.
(Continued)

*Primary Examiner* — Ismail A Muse
(74) *Attorney, Agent, or Firm* — The Roy Gross Law Firm, LLC; Roy D. Gross

(57) ABSTRACT

An LED panel structure includes a PCB board and a plurality of LEDs. The PCB board is provided with a plurality of data lines, a plurality of scanning lines and a plurality of via holes. The data lines and the scanning lines are respectively located at different layers of the PCB board. The LEDs are disposed on the PCB board to form LED rows and LED columns, each LED column includes a plurality of LED groups, and each LED group includes two adjacent LEDs. A plurality of adjacent LEDs are sequentially arranged in a second direction to form light-emitting pixels. The LED includes a common-electrode terminal and a non-common-electrode terminal. All common-electrode terminals in each LED column are connected to one scanning line through via holes. All non-common-electrode terminals in each LED row are connected to one data line. Two data lines are provided between adjacent LED groups.

17 Claims, 11 Drawing Sheets

(56) References Cited

U.S. PATENT DOCUMENTS

| | | | | |
|---|---|---|---|---|
| 2018/0175268 | A1* | 6/2018 | Moon | H01L 25/0753 |
| 2020/0135092 | A1* | 4/2020 | Ahmed | H10D 86/40 |
| 2021/0265546 | A1* | 8/2021 | Li | H01L 25/16 |
| 2022/0068998 | A1 | 3/2022 | Luo et al. | |

FOREIGN PATENT DOCUMENTS

| | | | |
|---|---|---|---|
| CN | 111462643 | A | 7/2020 |
| CN | 111540297 | A | 8/2020 |
| CN | 113012629 | A | 6/2021 |
| CN | 213751735 | U | 7/2021 |
| EP | 3680932 | A1 | 7/2020 |

OTHER PUBLICATIONS

PCT Written Opinion for International Application No. PCT/CN2022/110048, mailed Apr. 5, 2023, 3 pp.

European Patent Office, Supplementary European Search Report for European Patent Application No. 22919304, dated Jul. 25, 2024, 4pp.

* cited by examiner

DATA AND SCANNING LINES PATTERN OF AN LED PANEL STRUCTURE

CROSS-REFERENCE TO RELATED APPLICATION

This application is a continuation of International Application No. PCT/CN2022/110048 having international filing date of Aug. 3, 2022, which claims priority to and the benefit of Chinese Patent Application No. 202210792752.0 filed on Jul. 5, 2022. The contents of the above applications are all incorporated by reference as if fully set forth herein in their entireties.

TECHNICAL FIELD

The present disclosure relates to a field of LED display technology, and more particularly, to LED panel structures.

BACKGROUND

An LED display screen is a flat panel display, which is an apparatus composed of small LEDs for displaying various information such as text, images, videos, and the like. The LED electronic display screen combines the application of a microelectronic technology, a computer technology, and information processing, and has the advantages of bright color, wide dynamic range, high brightness, long service life, stable and reliable operation, and the like. Led displays are widely used in commercial media, cultural performance markets, stadiums, information dissemination, news release, securities trading, and the like.

In the design process of an existing LED display screen, a scanning line and a data line on the PCB board may cross. Therefore, the scanning line is usually provided on the surface layer of the PCB board, and the data line is provided on the inner layer or the bottom layer of the PCB board by adding via holes to the PCB board, so that the number of the via holes is equal to the number of the LEDs on the PCB board. Since the number of the via holes on the PCB board determines the yield of the PCB board, the more via holes, the higher the defect rate of the PCB board. Therefore, how to reduce the number of the via holes on the PCB board so as to improve the yield of the PCB board, reduce the waste of materials, and reduce the manufacturing cost of the PCB board is a technical problem urgently to be solved at present.

SUMMARY

An embodiment of the present disclosure provides an LED panel structure including: a PCB board provided with a plurality of data lines, a plurality of scanning lines and a plurality of via holes, the data lines and the scanning lines are respectively located at different layers of the PCB board, the data lines extend in a first direction, and the scanning lines extend in a second direction; and a plurality of LEDs arranged on the PCB board, the plurality of LEDs are arranged in an array along the first direction and the second direction to form a plurality of LED rows and a plurality of LED columns, the LED rows extend in the first direction, the LED columns extend in the second direction, each of the LED columns includes a plurality of LED groups, each of the LED groups includes two adjacent LEDs, a plurality of adjacent LEDs are sequentially arranged in the second direction to form a plurality of light-emitting pixels, and each of the LEDs includes a common-electrode terminal and a non-common-electrode terminal. Common-electrode terminals of all LEDs in each of the LED columns are connected to a corresponding one of the scanning lines through one or more corresponding via holes of the via holes. Non-common-electrode terminals of all LEDs in each of the LED rows are connected to a corresponding one of the data lines, and two data lines are arranged between adjacent LED groups.

According to a second aspect, an embodiment of the present disclosure further provides an LED panel structure including a PCB board for mounting a plurality of LEDs. The PCB board including: M data lines extending in a first direction, wherein M≥4 and is an integer; N scanning lines extending in a second direction, wherein N≥2 and is an integer; and a plurality of terminal pairs located on a surface layer of the PCB board, wherein the plurality of terminal pairs are arranged in an array along the first direction and the second direction to form M rows of terminal pairs and N columns of terminal pairs, each of the terminal pairs includes a first terminal and a second terminal, first terminals of all terminal pairs in an i-th row of terminal pairs are connected to an i-th data line, and second terminals of all terminal pairs in a j-th column of terminal pairs are connected to a j-th scanning line. In a thickness direction of the PCB board, orthographic projections of the i-th data line and an (i+1)-th data line are located between orthographic projections of the i-th row of terminal pairs and an (i+1)-th row of terminal pairs.

DESCRIPTION OF DRAWINGS

In order to more clearly explain the technical solutions in the embodiments of the present disclosure, the following will briefly introduce the drawings required in the description of the embodiments. Obviously, the drawings in the following description are only some embodiments of the present disclosure. For those skilled in the art, without paying any creative work, other drawings can be obtained based on these drawings.

DETAILED DESCRIPTION

Figure 1:
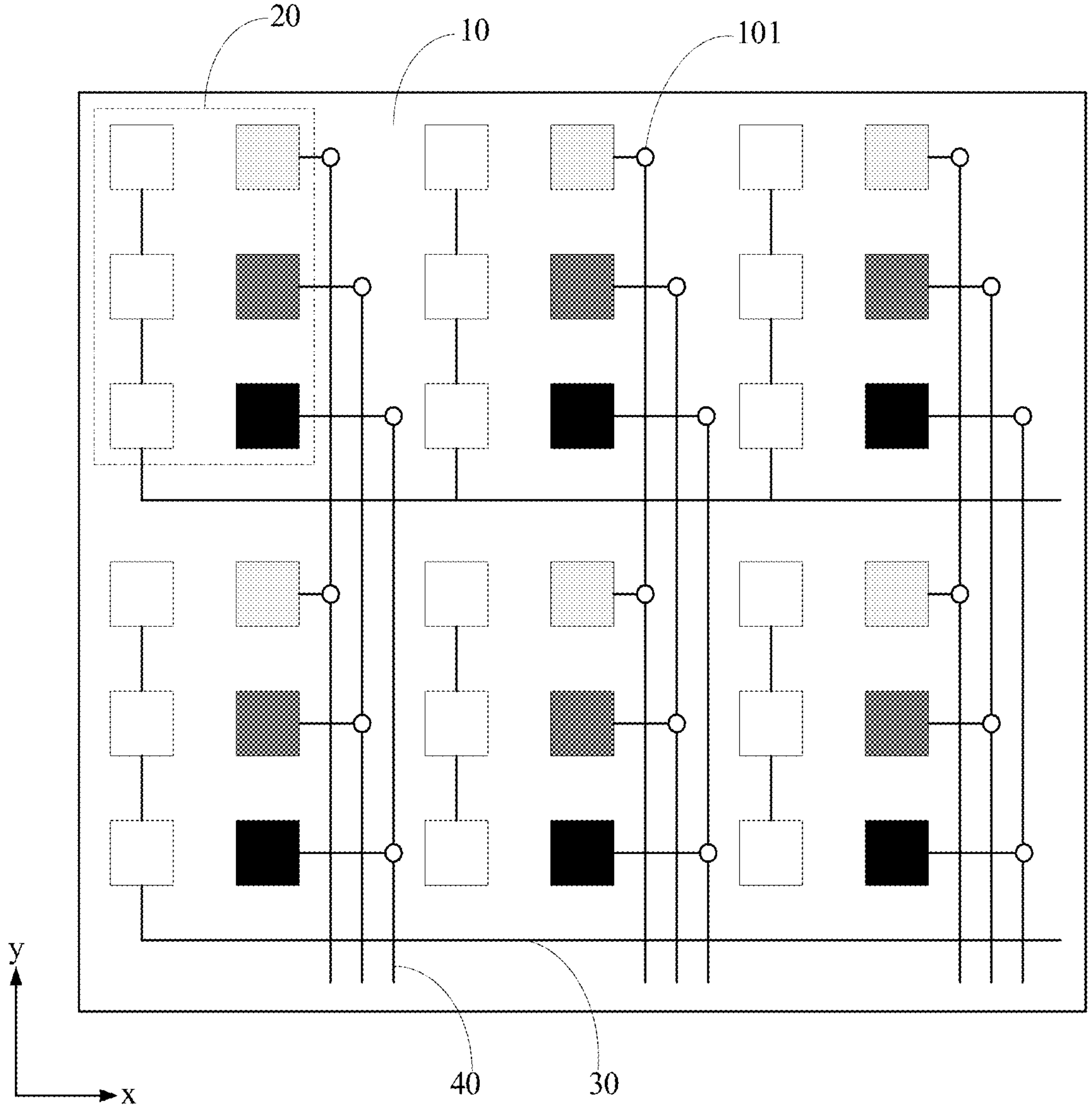
FIG. 1 is a schematic diagram of an LED panel structure in a related art.

Technical solutions in embodiments of the present disclosure will be clearly and completely described below in conjunction with drawings in the embodiments of the present disclosure. Obviously, the described embodiments are only a part of embodiments of the present disclosure, rather than all the embodiments. Based on the embodiments in the present disclosure, all other embodiments obtained by those skilled in the art without creative work fall within the protection scope of the present disclosure.

In the description of the present disclosure, it should be understood that orientations or position relationships indicated by the terms “center”, “lateral”, “upper”, “lower”, “left”, “right”, “vertical”, “horizontal”, “top”, “bottom”, “inside”, “outside”, “column,” “row,” and the like, are based on orientations or position relationships illustrated in the drawings. The terms are used to facilitate and simplify the description of the present disclosure, rather than indicate or imply that the devices or elements referred to herein are required to have specific orientations or be constructed or operate in the specific orientations. Accordingly, the terms should not be construed as limiting the present disclosure.

In the present disclosure, the word “some embodiments” is used to mean “serving as an example, illustration, or explanation”. Any embodiment described as exemplary in the present disclosure is not necessarily construed as being more preferable or advantageous than other embodiments. In order to enable any person skilled in the art to implement and use the present disclosure, the following description is given. In the following description, the details are listed for the purpose of explanation. It should be understood that those of ordinary skill in the art can realize that the present disclosure can also be implemented without using these specific details. In other instances, well-known structures and processes will not be elaborated to avoid unnecessary details to obscure the description of the present disclosure. Therefore, the present disclosure is not intended to be limited to the illustrated embodiments, but is consistent with the widest scope that conforms to the principles disclosed in the present disclosure.

It should be noted that a first direction and a second direction mentioned in the embodiments of the present disclosure are perpendicular to each other, and the first direction may be a column direction or a row direction. Similarly, the second direction corresponds to the row direction or the column direction, and the first direction and the second direction may be interchanged in actual application. When the first direction is an x direction indicated in FIGS. 1 to 7, the second direction is a y direction indicated in FIGS. 1 to 7, the LED row is a row shown in drawings, the LED column is a column shown in drawings, the x direction in FIGS. 1 to 7 is a row direction, and the y direction is a column direction.

Referring to FIG. 1, there is shown a schematic diagram of an LED panel structure in a related art. As shown in FIG. 1, a plurality of light-emitting pixels 20 with the same structure are arranged on a PCB board 10 in an array manner, and each of the light-emitting pixels 20 includes three LEDs of different light-emitting colors, such as, a red LED, a blue LED, and a green LED, so that both the LEDs and the light-emitting pixels 20 are arranged on the PCB board 10 in an array manner. Common-electrode terminals of all the LEDs in each row of the light-emitting pixels 20 are electrically connected to each other on the surface layer of the PCB board 10 to form one row scanning line, and non-common-electrode terminals of the LEDs of the same light-emitting color in each column of the light-emitting pixels 20 are electrically connected to each other on the inner or bottom layer of the PCB board 10 through via holes 101 on the PCB board 10 to form one column data line. Here, the strobe chip performs progressive scanning of the pixels on the PCB board 10 through scanning lines 30, and the driver chip applies different currents through data lines 40 to obtain different colors in various light-emitting pixels 20, thereby obtaining a complete image on the PCB board 10.

As can be seen from FIG. 1, the number of the via holes 101 in the PCB board 10 is determined by the number of the LEDs, and three via holes 101 are required for each light-emitting pixel 20 to enable the data lines 40 to be led to the inner or bottom layer of the PCB board 10.

Figure 2:
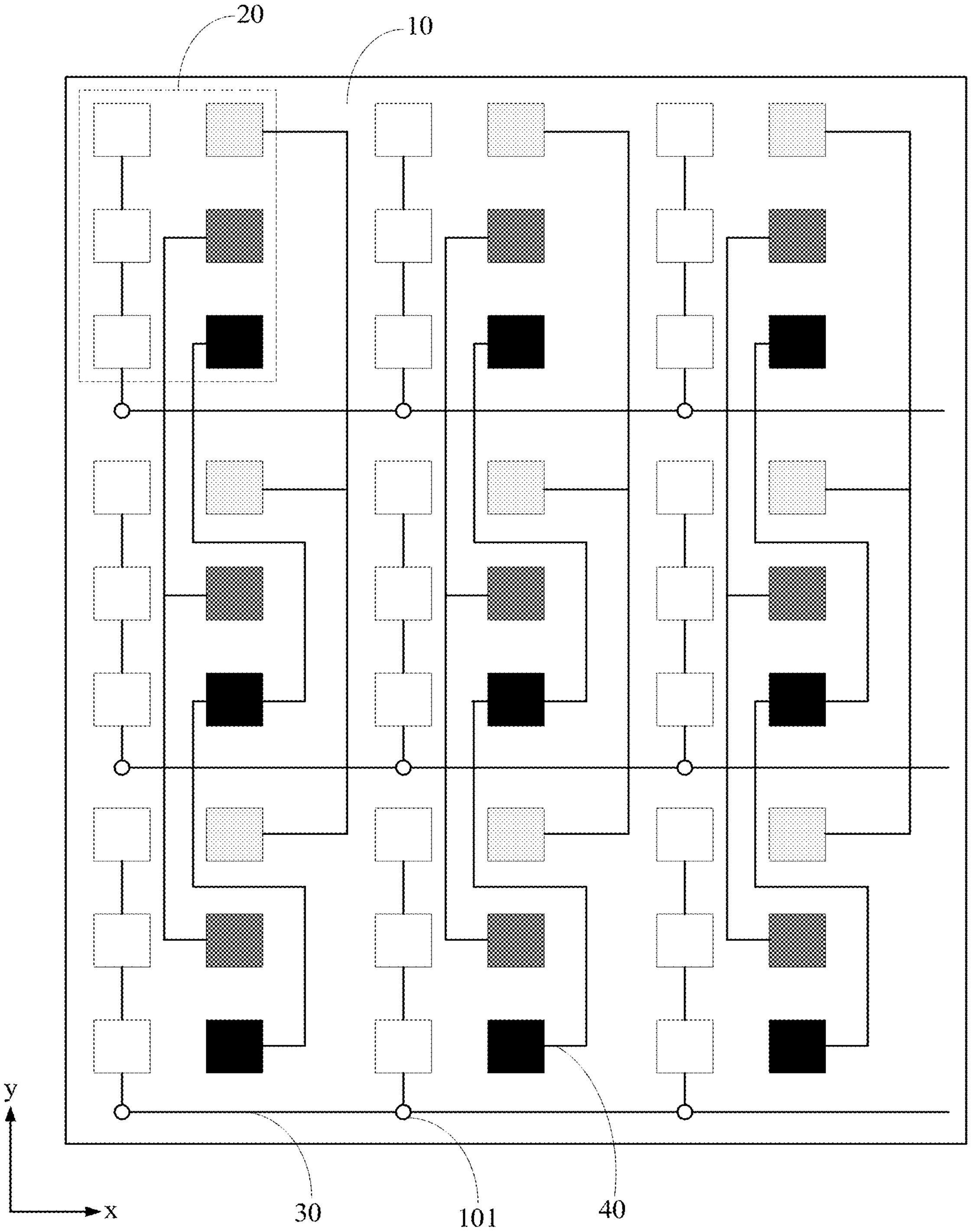
FIG. 2 is another schematic diagram of an LED panel structure in a related art.

Referring to FIG. 2, FIG. 2 is a schematic diagram of another LED panel structure in a related art. As shown in FIG. 2, a plurality of light-emitting pixels 20 of the same structure are arranged in an array on a PCB board 10, and each of the light-emitting pixels 20 includes three LEDs of different light-emitting colors, such as, a red LED, a blue LED, and a green LED, so that both the LEDs and the light-emitting pixels 20 are arranged in an array on the PCB board 10. Common-electrode terminals of all the LEDs in each row of light-emitting pixels 20 are electrically connected to each other on the inner or bottom layer of the PCB board 10 through via holes 101 in the PCB board 10 to form one row scanning line, and non-common-electrode terminals of the LEDs of the same light-emitting color in each column of light-emitting pixels 20 are electrically connected to each other on a surface layer of the PCB board 10 to form one column data line 40.

As can be seen from FIG. 2, in order to avoid the problem of intersection of the scanning line 30 and the data line 40 and to reduce the number of the via holes 101 on the PCB board 10, in each column of light-emitting pixels 20, two data lines 40 need to pass between the positive and negative electrodes of one or more LEDs. Although only one via hole 101 is required for each light-emitting pixel 20 in FIG. 2, due to the constraints of the wiring rules of the PCB board 10, the data line 40 passing between the positive and negative electrodes of the LEDs will inevitably cause the size of the LEDs to be increased, thereby causing a sharp increase in cost. As an example of the conventional COB chip 0408 (4 mil×8 mil), the distance between the positive and negative electrodes of the COB chip is only 75 μm, and generally, the pad spacing on the PCB board 10 should be designed to be smaller than the pad spacing on the COB chip to prevent the occurrence of misalignment, so the value of the pad spacing on the PCB board 10 is generally 70 μm. In accordance with the process level of the PCB board 10, the line width and the line spacing of the general wirings are both 100 μm. If two data lines 40 both pass between the positive and negative electrodes of the COB chip, the distance between the positive and negative electrodes of the COB chip is at least 500 μm. In this case, the COB chip must be much larger than the design size of the original 75 μm of the diode, which will make the diode very large and cause the manufacturing cost to increase sharply.

Figure 3:
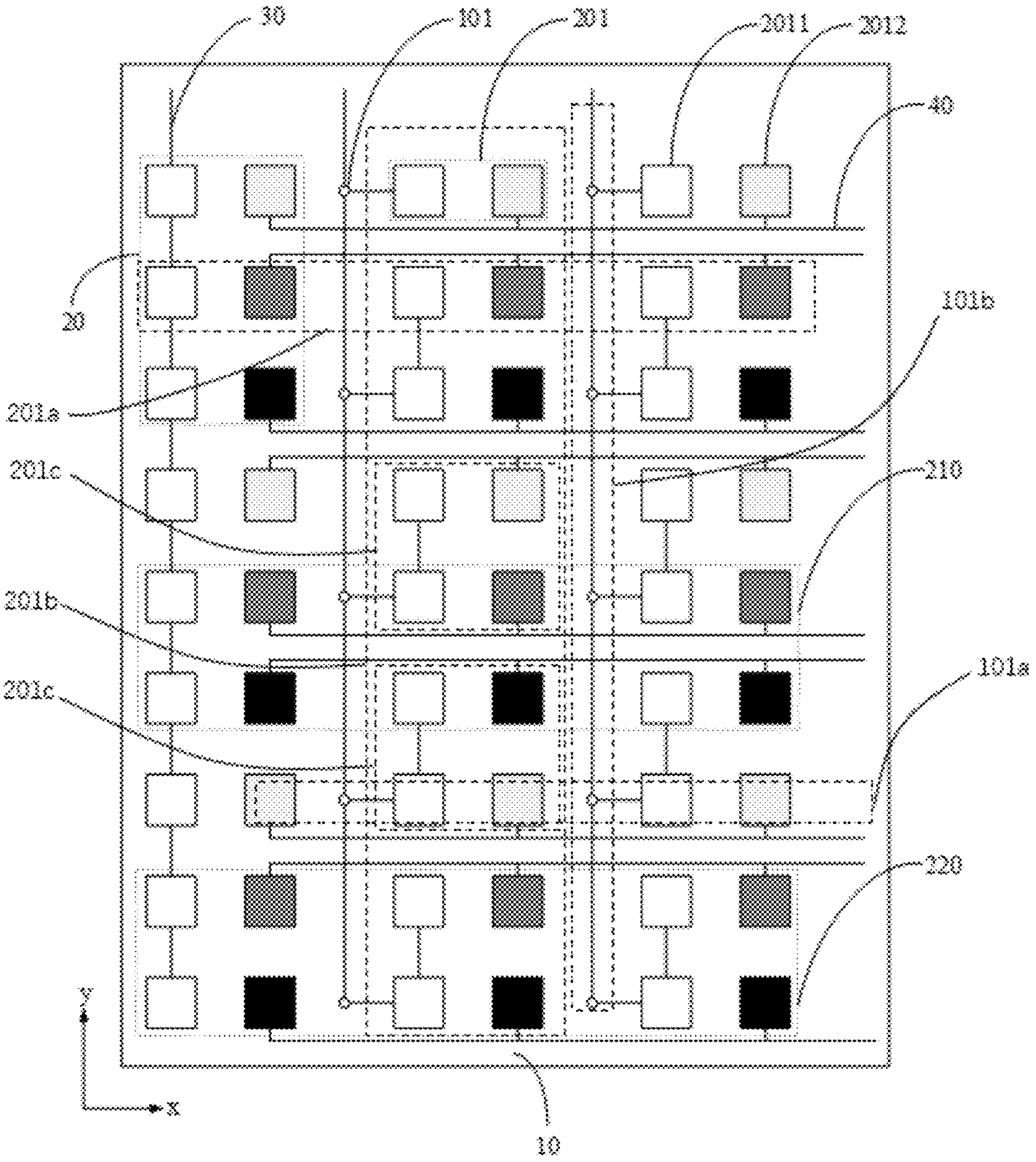
FIG. 3 is a schematic diagram of an LED panel structure according to an embodiment of the present disclosure.
Figure 4:
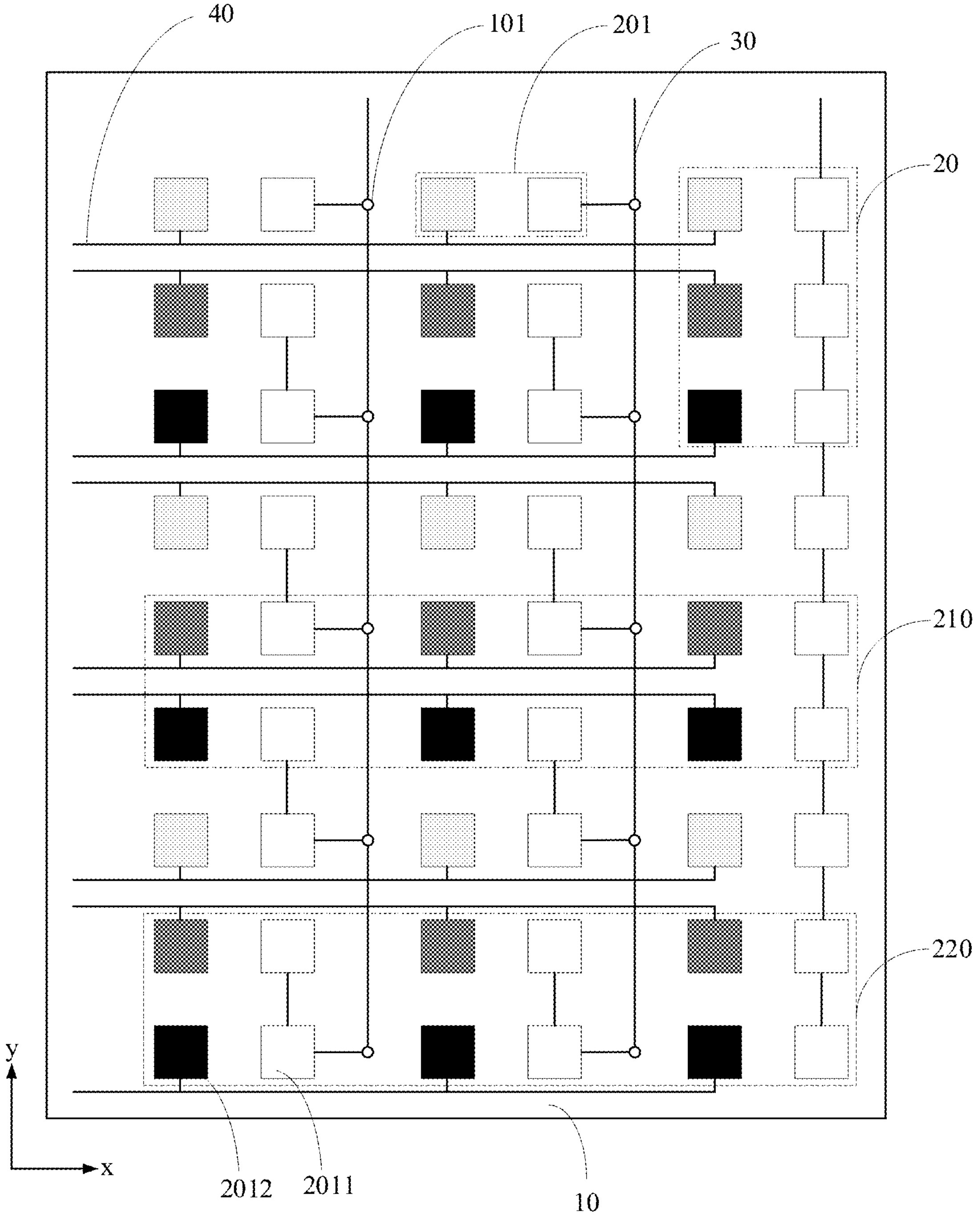
FIG. 4 is a schematic diagram of an LED panel structure according to another embodiment of the present disclosure.

Referring to FIGS. 3 and 4, FIG. 3 is a schematic diagram of an LED panel structure according to an embodiment of the present disclosure, and FIG. 4 is a schematic diagram of an LED panel structure according to another embodiment of the present disclosure. As shown in FIGS. 3 and 4, an LED panel structure includes a PCB board 10 and a plurality of LEDs 201.

The above PCB board 10 is provided with a plurality of scanning lines 30, a plurality of data lines 40, and a plurality of via holes 101. The data lines 40 extend in a first direction, the scanning lines 30 extend in a second direction, the plurality of data lines 40 are arranged at intervals in the second direction, and the plurality of scanning lines 30 are arranged at intervals in the first direction. The data lines 40 and the scanning lines 30 are located on different layers of the PCB board 10, respectively, for example, the scanning lines 30 may be arranged on an inner layer or a bottom layer of the PCB board 10, and the data lines 40 are arranged on a surface layer of the PCB board 10. The first direction and the second direction intersect each other, for example, the first direction and the second direction are at an angle of 90° to each other. The first direction is an X-axis direction, and the second direction is a Y-axis direction.

The plurality of LEDs 201 described above are arranged on the PCB board 10, the plurality of LEDs 201 are arranged in an array manner along the first direction and the second direction to form a plurality of LED rows 201*a* and a plurality of LED columns 201*b*, the LED rows 201*a* extend in the first direction, the LED columns 201*b* extend in the second direction, the plurality of LED rows 201*a* are arranged at intervals in the second direction, and the plurality of LED columns 201*b* are arranged at intervals in the first direction. Each of the LED columns 201*b* includes a plurality of LED groups 201*c*, and each of the LED groups 201*c* includes two adjacent LEDs 201. A plurality of adjacent LEDs 201 are sequentially arranged in the second direction to form a plurality of light-emitting pixels 20. The LED 201 includes a common-electrode terminal 2011 and a non-common-electrode terminal 2012. The common-electrode terminals 2011 of all the LEDs 201 in each of the LED columns 201*b* are connected to one scanning line 30 through a via hole 101. The non-common-electrode terminals 2012 of all the LEDs 201 in each of the LED rows 201*a* form one data line 40. Two data lines 40 are disposed between adjacent LED groups 201*c*.

According to the LED panel structure provided in the embodiment of the present disclosure, the plurality of LEDs 201 arrayed in the first direction and the second direction are provided on the PCB board 10, the plurality of adjacent LEDs 201 are arranged in the second direction sequentially to form a plurality of light-emitting pixels 20, two data lines 40 are provided between adjacent LED groups 201*c*, and no LED 201 is provided between two data lines 40 between adjacent LED groups 201*c*, so that the distance between the two data lines 40 is small, thereby reducing the size of the PCB board 10 and reducing the manufacturing cost of the PCB board.

In some embodiments, a plurality of via holes 101 are arranged in an array in the first direction and the second direction to form a plurality of via hole rows 101*a* and a plurality of via hole columns 101*b*. The via hole rows 101*a* extend in the first direction, and the plurality of via hole rows 101*a* are arranged at intervals in the second direction. The via hole columns 101*b* extend in the second direction, and the plurality of via hole columns 101*b* are arranged at intervals in the first direction. Two data lines 40 are disposed between adjacent via hole rows 101*a*.

It may be appreciated that the via holes 101 on the entire PCB board 10 are arranged in an array, which is convenient for the processing of the via holes 101. The via holes 101 may be provided on the scanning lines 30 of the PCB board 10. The via hole column 101*b* is formed to correspond to the scanning line 30. The spacing between the via hole column 101*b* and the scanning line 30 along the first direction is small, further reducing the size of the PCB board 10.

In some embodiments, the number of the via holes 101 is less than the number of the LEDs 201.

It may be appreciated that the common-electrode terminals 2011 of the plurality of LEDs 201 are connected to the same via hole 101 to reduce the number of the via holes 101. Compared with the case where one LED 201 corresponds to one via hole 101, the number of the via holes 101 is reduced, the yield of the PCB board 10 is improved, the waste of materials is reduced, and the manufacturing cost of the PCB board 10 is reduced.

In some embodiments, the common-electrode terminals 2011 of the two LEDs 201 of the LED group 201*c* are connected to the same via hole 101. Compared with the case where one LED 201 corresponds to one via hole 101, every two LEDs 201 share one via hole 101, the common-electrode terminals 2011 of all the LEDs 201 in the LED column 201*b* are connected to one scanning line 30 through the plurality of via holes 101, and the non-common-electrode terminals 2012 of the plurality of LEDs 201 in the LED row 201*a* are connected to each other on the surface layer of the PCB board 10 to form one data line 40, so that the number of the via holes 101 in the PCB board 10 is less than the number of the LEDs 201, thereby improving the yield of the PCB board 10, reducing waste of materials, and reducing the manufacturing cost of the PCB board 10.

Specifically, when all the LEDs 201 are arranged in the manner shown in FIG. 3, that is, the common-electrode terminals 2011 of the LEDs 201 are located on the left sides of the LEDs 201, and the non-common-electrode terminals 2012 are located on the right sides of the LEDs 201, the non-common-electrode terminals 2012 in the LED row 201*a* are electrically connected to each other on the surface layer of the PCB board 10 to form one data line 40 in the first direction. The data line 40 may be directly routed between the two LEDs 201 without passing through the gap region between the cathode and the anode of any LED 201 on the PCB board 10. The common-electrode terminals 2011 of all the LEDs 201 in a first row in the second direction are electrically connected to each other on the surface layer of the PCB board 10 without increasing the size of the LEDs 201, so as to form one scanning line 30 in the second direction. No via hole 101 is required for each LED 201 in the first row, it can be realized that the common-electrode terminals 2011 of all the LEDs 201 in the first row are electrically connected to each other on the surface layer of the PCB board 10, thereby reducing the number of the via holes 101 in the PCB board 10.

Similarly, when all the LEDs 201 are arranged in the manner shown in FIG. 4, that is, the common-electrode terminals 2011 of the LEDs 201 are located on the right sides of the LEDs 201, and the non-common-electrode terminals 2012 are located on the left sides of the LEDs 201, the non-common-electrode terminals 2012 in the LED row 201*a* are electrically connected to each other on the surface layer of the PCB board 10, so as to form one data line 40 in the first direction. The data line 40 can be directly routed between the two LEDs 201 without passing through the gap region between the cathode and the anode of any LED 201 on the PCB board 10. Similarly, without increasing the size of the LEDs 201, the common-electrode terminals 2011 of all the LEDs 201 in the last row in the second direction are electrically connected to each other on the surface layer of the PCB board 10, so as to form one scanning line 30 in the second direction. Likewise, no via hole 101 is required for each LED 201 in the last row, it can be realized that the common-electrode terminals 2011 of all the LEDs 201 in the last row are electrically connected to each other on the surface layer of the PCB board 10, thereby reducing the number of the via holes 101 in the PCB board 10.

Figure 5:
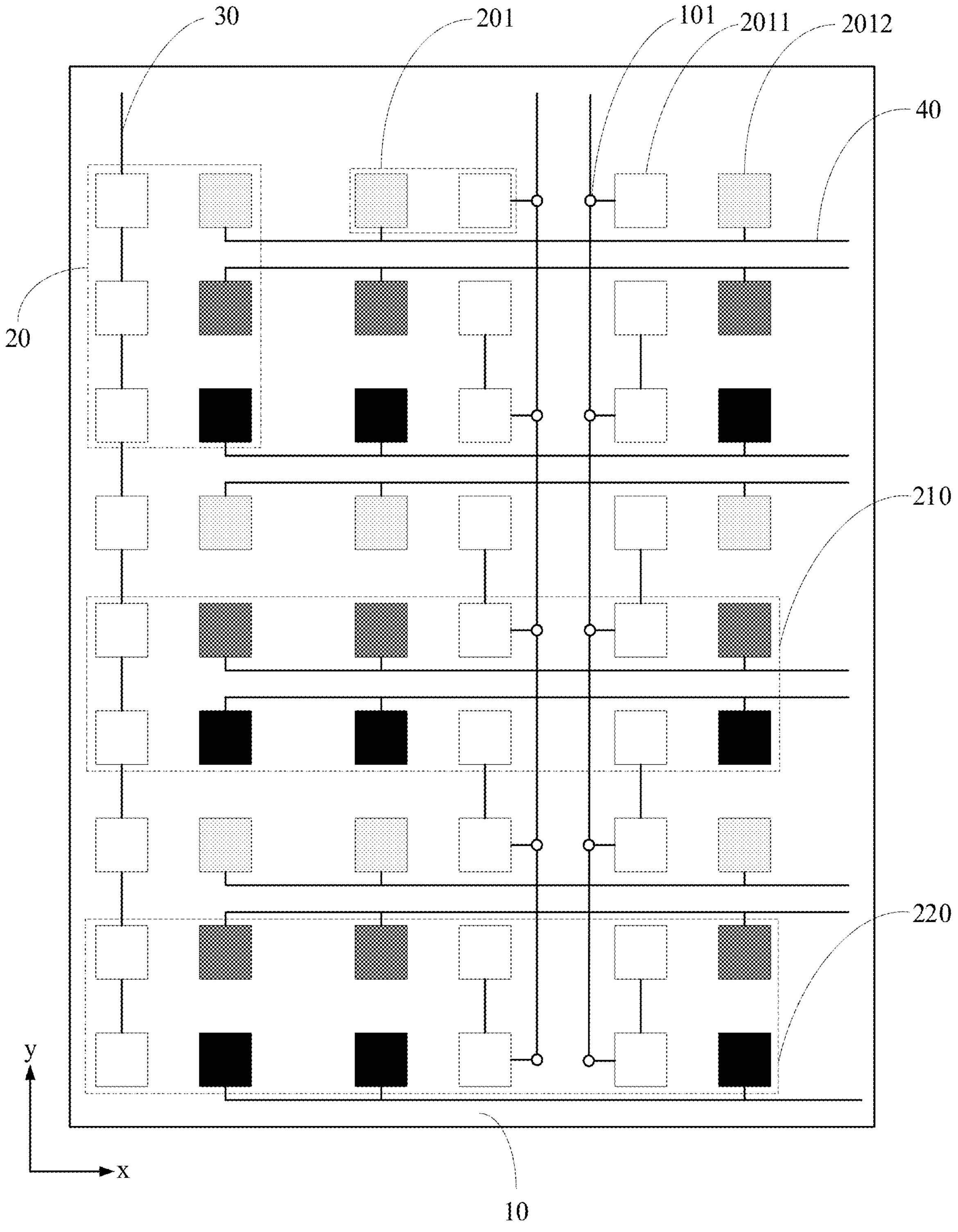
FIG. 5 is a schematic diagram of an LED panel structure according to another embodiment of the present disclosure.

In the present disclosure, each LED 201 on the PCB board 10 may be an LED 201 with the same size or may be an LED 201 with a different size. The arrangement of the LEDs 201 on the PCB board 10 may be the same, or may be different. When the arrangement of the LEDs 201 on the PCB board 10 is different, there may be several groups of two adjacent rows of LEDs 201 of which the common-electrode terminals 2011 or the non-common-electrode terminals 2012 are adjacent to each other. As shown in FIG. 5, the non-common-electrode terminals 2012 of the LEDs 201 in the first row in the second direction may be adjacent to the non-common-electrode terminals 2012 of the LEDs 201 in the second row, the common-electrode terminals 2011 of the LEDs 201 in the second row may be adjacent to the common-electrode terminals 2011 of the LEDs 201 in the third row, and it is also possible to realize that the common-electrode terminals 2011 of the LEDs 201 in each of the plurality of columns in the second direction are electrically connected to each other through the via holes 101 to form one scanning line 30 in the second direction, and the non-common-electrode terminals 2012 of the LEDs 201 in each row in the first direction are electrically connected to each other on the surface layer of the PCB board 10 to form one data line 40 in the first direction, so that the number of the via holes 101 in the PCB board 10 is smaller than the number of the LEDs 201, thereby improving the yield of the PCB board 10, reducing waste of materials, and reducing the manufacturing cost of the PCB board 10.

Meanwhile, the common-electrode terminal 2011 of the LED 201 may be a common cathode or a common anode. The gap region between the two rows of LEDs 201 in the first direction can be used for one data line 40 or two data lines 40.

In addition, after the non-common-electrode terminals 2012 of the LEDs 201 in each row in the first direction are electrically connected to each other on the surface layer of the PCB board 10 to form one data line 40 in the first direction, LEDs 201 in each row needs to be LEDs 201 of the same light-emitting color, so that the scanning line 30 in the LED display screen is changed from the row scanning line to the column scanning line, and the data line 40 is changed from the column data line to the row data line.

In some embodiments, the surface of the PCB board 10 is provided with a plurality of connection patterns, which connect the common-electrode terminals 2011 of the two LEDs 201 of the LED group 201*c*, and each connection pattern connects the corresponding scanning line 30 through the via hole 101.

It may be appreciated that the scanning line 30 and the data line 40 are located on different layers of the PCB board 10, for example, the scanning line 30 is located on the inner side or the bottom layer of the PCB board 10, and the data line 40 is located on the inner surface layer of the PCB board 10. The non-common-electrode terminal 2012 of the LED 201 is connected to the data line 40 on the surface layer of the PCB board 10. The common-electrode terminal 2011 of the LED 201 is connected to the scanning line 30 through the via hole 101. The common-electrode terminals 2011 of the LEDs 201 are also connected to the surface layer of the PCB board 10. If the common-electrode terminal 2011 of the LED 201 is connected to the via hole 101, a connection pattern is necessarily provided on the surface layer of the PCB board 10. The common-electrode terminal 2011 of the LED 201 is connected to the via hole 101 through the connection pattern, which is convenient for the assembly of the LED 201 and the PCB board 10, and the operation is simple.

In some embodiments, a plurality of LEDs 201 of two adjacent LED rows in the first direction form a first LED row group 210, the data line 40 corresponding to each row of the LEDs 201 in the first LED row group 210 passes through the first LED row group 210 along the first direction. Specifically, the data line 40 corresponding to each of the LED rows 201*a* in the first LED row group 210 passes through the gap region between the two LED rows 201*a* in the first LED row group 210 along the first direction. At this time, common-electrode terminals 2011 of one of the LED rows 201*a* in the first LED row group 210 can be electrically connected to common-electrode terminals 2011 of a LED row 201*a* above the first LED row group 210 on the surface layer of the PCB board 10, and common-electrode terminals 2011 of another of the LED rows 201*a* in the first LED row group 210 and the common-electrode terminals 2011 of a LED row 201*a* below the first LED row group 210 can form the scanning line 30 in the second direction through the via hole 101 in the PCB board 10, thereby further reducing the number of the via holes 101 in the PCB board 10 and improving the yield of the PCB board 10.

In some embodiments, in the first LED row group 210, the common-electrode terminals 2011 of a plurality of the LEDs 201 in any one row are electrically connected to each other through the via holes 101 to enable a plurality of scanning lines 30 at corresponding positions in the first LED row group 210 to be disposed on the inner or bottom layer of the PCB board 10. Specifically, in the first LED row group 210, there is no need to provide a via hole 101 for each of all the LEDs 201 on the PCB board 10. Common-electrode terminals 2011 of a part of the LEDs 201 in the first LED row group 210 may be connected with common-electrode terminals 2011 of lower LEDs 201 below them respectively through wiring on the surface layer of the PCB board 10, and common-electrode terminals 2011 of remaining LEDs 201 in the first LED row group 210 may be connected to the wiring on the inner layer or bottom layer of the PCB board 10 directly through the via holes 101 in the PCB board 10.

It may be appreciated that each of all the first LED row groups 210 in the first direction is formed by two adjacent LED rows 201*a*. One first LED row group 210 may be present on the PCB board 10, or a plurality of the first LED row groups 210 may be present on the PCB board 10. The number of the first LED row groups 210 may be specifically selected depending on the actual application, which is not specifically limited in the present disclosure.

Figure 6:
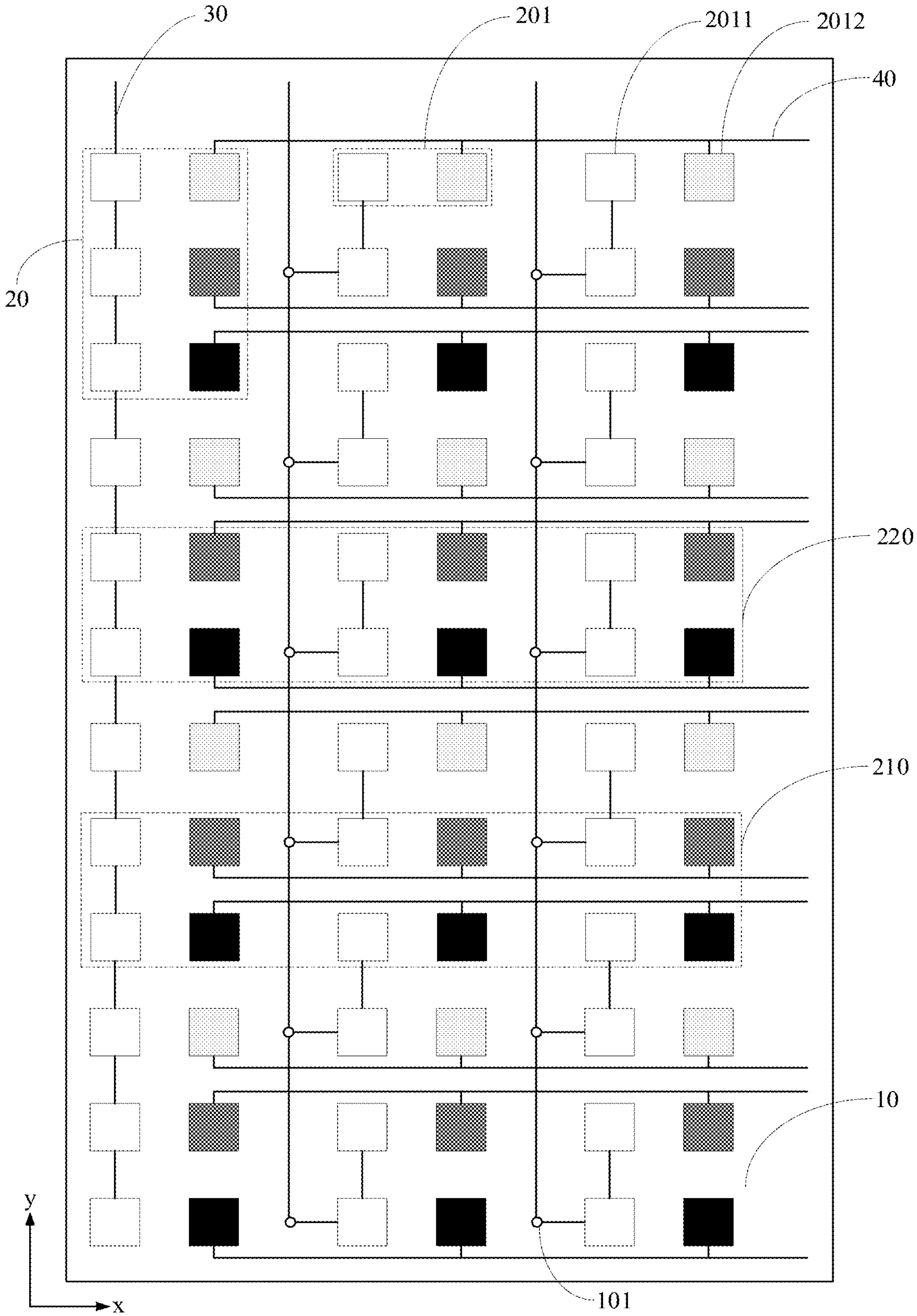
FIG. 6 is a schematic diagram of an LED panel structure according to another embodiment of the present disclosure.

It may also be appreciated that any two adjacent LED rows 201*a* in the first direction may form the first LED row group 210, a first LED row 201*a* and a second LED row 201*a* may form the first LED row group 210 as shown in FIG. 3 and FIG. 4, the second LED row 201*a* and a third LED row 201*a* may form the first LED row group 210 as shown in FIG. 6, and the first LED row groups 210 may be formed in such a manner specifically selected according to actual application, which is not specifically limited in the present disclosure.

Meanwhile, in order to minimize the number of the via holes 101 in the PCB board 10, if there is an LED 201 above the first LED row group 210, the common-electrode terminal 2011 of the LED 201 in the first LED row group 210 adjacent to the upper LED 201 may share one via hole 101 with a common-electrode terminal 2011 of the upper LED 201, that is, two common-electrode terminals 2011 are connected by wiring on the surface layer of the PCB board 10, as long as one of the two common-electrode terminals 2011 is electrically connected to the common-electrode terminal 2011 of the other row on the inner or bottom layer of the PCB board 10 through the via hole 101. If there is an LED 201 below the first LED row group 210, the common-electrode terminal 2011 of the LED 201 in the first LED row group 210 adjacent to the lower LED 201 may share one via hole 101 with a common-electrode terminal 2011 of the lower LED 201, that is, two common-electrode terminals 2011 are connected by wiring on the surface layer of the PCB board 10, as long as one of the two common-electrode terminals 2011 is electrically connected to the common-electrode terminal 2011 of the other row on the inner or bottom layer of the PCB board 10 through the via hole 101.

In some embodiments, in the LED panel structure, a plurality groups of two adjacent LED rows 201*a* in the first direction form second LED row groups 220 respectively, the common-electrode terminals 2011 of the adjacent LEDs 201 in the two rows in the second LED row group 220 are electrically connected to each other on the surface layer of the PCB board 10.

It may be appreciated that the second LED row group 220 in the first direction may likewise be formed by the two adjacent LED rows 201*a*, and the gap region between the two adjacent LED rows 201 may be used to route between the common-electrode terminals 2011 of the adjacent LEDs 201 in the two rows on the surface layer of the PCB board 10, so that the two adjacent LEDs 201 share one via hole 101 in the PCB board 10, thereby reducing the number of the via holes 101 in the PCB board 10, increasing the yield of the PCB board 10, and reducing the manufacturing cost of the PCB board 10.

It may also be appreciated that each of all the second LED row groups 220 in the first direction is formed by two adjacent LED rows 201*a*. One second LED row group 220 may be present on the PCB board 10, or a plurality of the second LED row groups 220 may be present on the PCB board 10. Any two adjacent LED rows 201*a* may form the second LED row group 220, a first LED row 201*a* and a second LED row 201*a* may form the second LED row group 220 as show in FIG. 6, and the second LED row 201*a* and a third LED row 201*a* may form the second LED row group 220 as shown in FIGS. 3 and 4. The number of the second LED row groups 220, and the forming manner of the second LED row groups 220 may be specifically selected according to the actual application, which is not specifically limited in the present disclosure.

Figure 7:
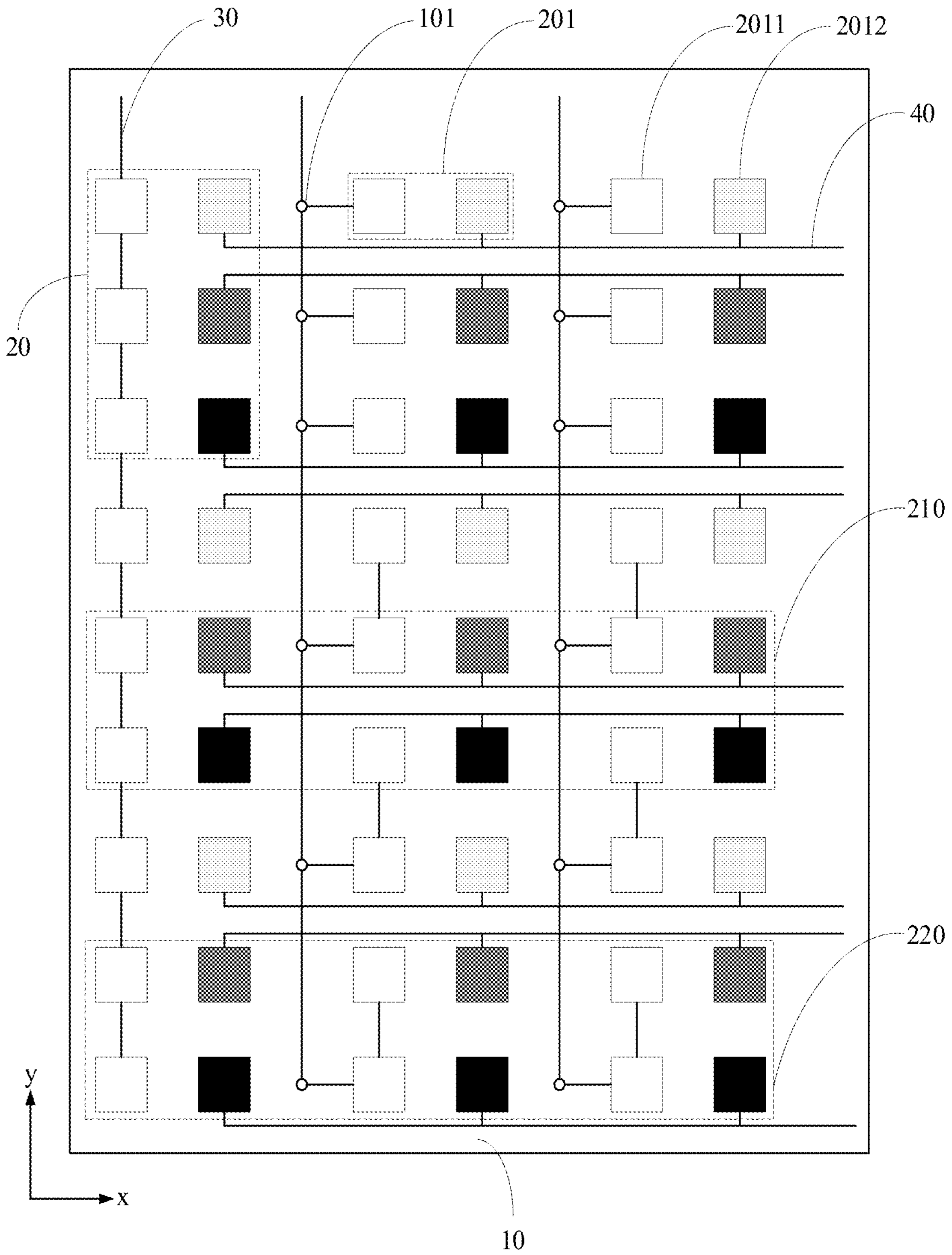
FIG. 7 is a schematic diagram of an LED panel structure according to another embodiment of the present disclosure.
Figure 8:
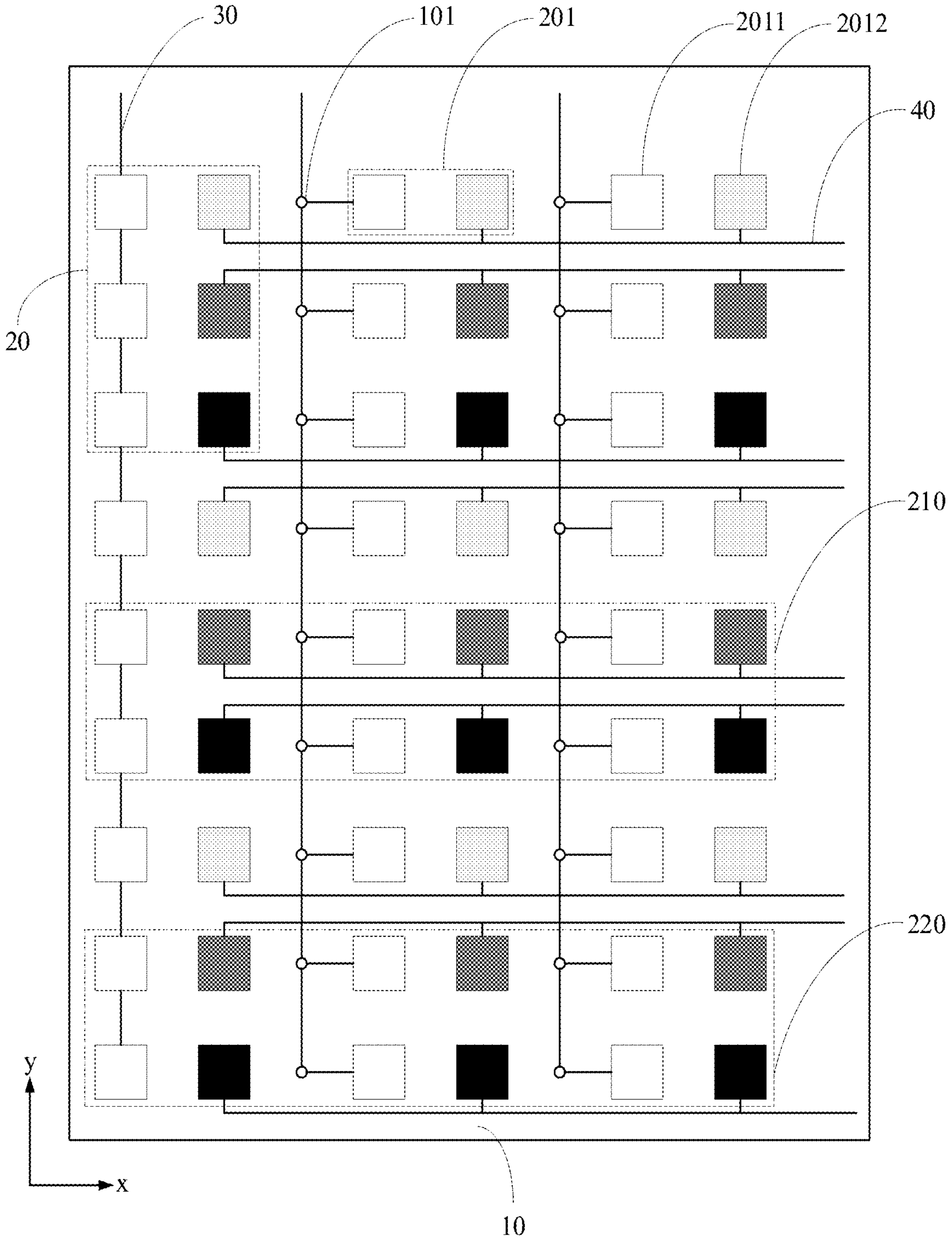
FIG. 8 is a schematic diagram of an LED panel structure according to another embodiment of the present disclosure.

In some embodiments, as shown in FIG. 7, the common-electrode terminals 2011 of a part of the LEDs 201 in the LED column 201*b* may pass through the via holes 101 in the PCB board 10 to form the scanning lines 30 in the second direction. As shown in FIG. 8, except for the leftmost LED column 201*b* of the LED columns 201*b*, the common-electrode terminals 2011 of the LEDs 201 in each of the remaining LED columns 201*b* may pass through the via holes 101 in the PCB board 10 to form the scanning lines 30 in the second direction. Compared with the arrangement of the LEDs 201 in the prior art, the arrangement of the LEDs 201 shown in FIGS. 7 and 8 may reduce the number of the via holes 101 in the PCB board 10.

In some embodiments, the light-emitting pixels 20 are arrayed in the first direction and the second direction. The LED 201 may be any one of a red LED, a blue LED, and a green LED. In this embodiment, each light-emitting pixel 20 may be the same, and each light-emitting pixel 20 may be formed by the red LED, the blue LED, and the green LED. The red LED, the blue LED, and the green LED may be vertically arranged from top to bottom in a second direction in sequence, so that the left and right viewing angles of the LED display screen are symmetrical, and the left and right viewing angles of the LED display screen formed into a finished product are maximized.

It may be appreciated that the arrangement of the LEDs 201 in FIGS. 3 to 8 can be rotated by 90 degree in practical applications, that is, the column scanning lines formed in FIGS. 3 to 7 become row scanning lines, the row data lines formed in FIGS. 3 to 7 become column data lines, and the LEDs 201 in each of the light-emitting pixels 20 are arranged horizontally.

It may also be appreciated that the LEDs 201 in the LED panel structure provided in the embodiments of the present disclosure may be packaged on the PCB board 10 in a COB (Chip On Board) manner, or may be packaged on the PCB board 10 in a SMD (Surface Mounted Devices) manner, which may be selected according to the specific situation in the actual application, and is not specifically limited in the present disclosure.

In some embodiments, the spacing between adjacent LEDs 201 within each LED column 201*b* is the same.

It may be appreciated that the spacing between adjacent LEDs 210 is exactly the same or approximately the same. For example, when the error of the spacing between the adjacent LEDs 210 may be within ±10% of the set range, the spacing between the adjacent LEDs 210 may be considered to be the same.

Figure 9:
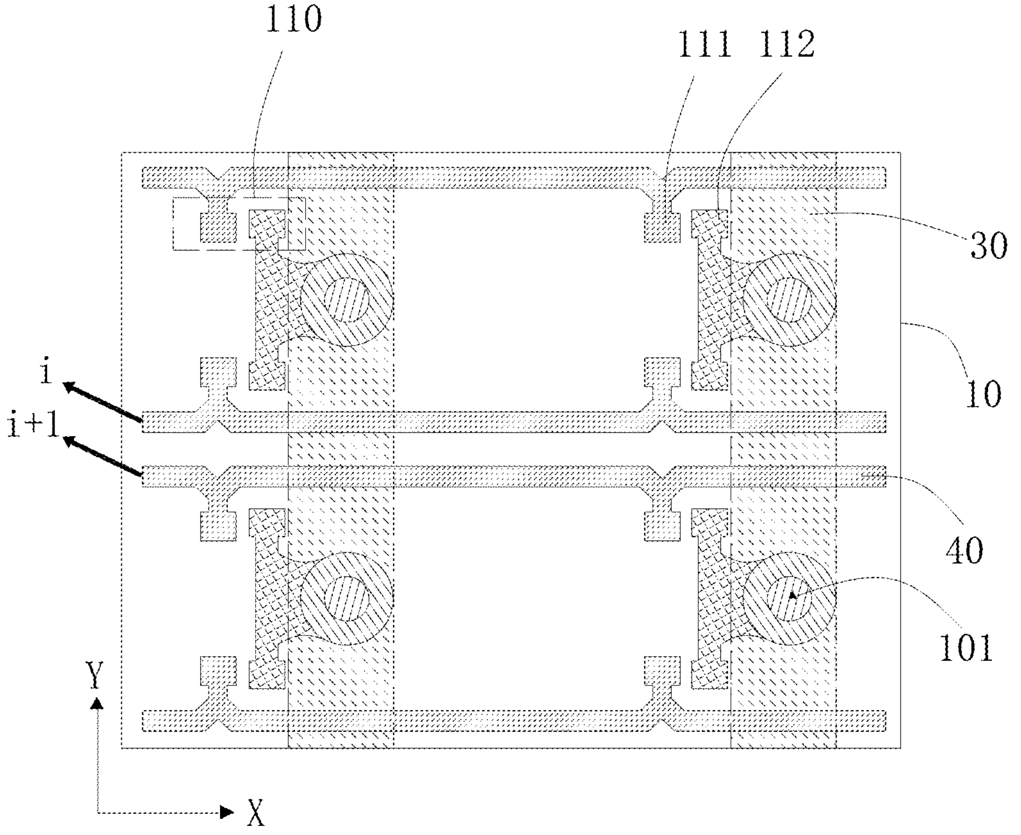
FIG. 9 is a schematic diagram of a wiring layout of a PCB board according to an embodiment of the present disclosure.
Figure 10:
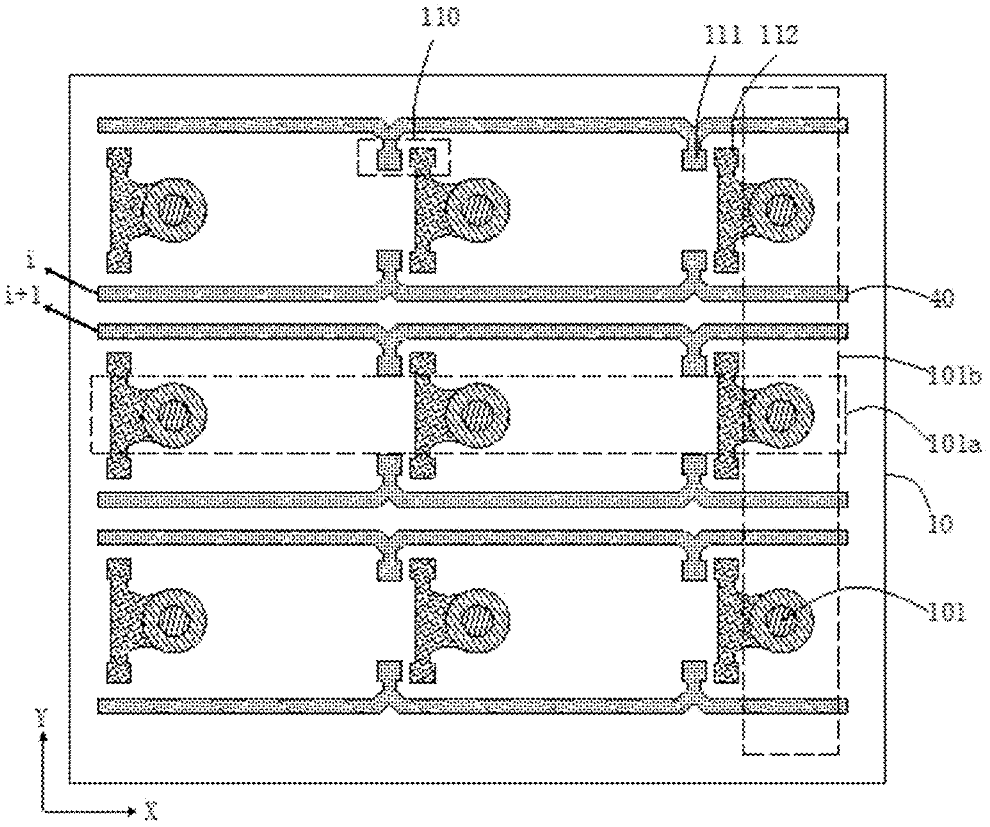
FIG. 10 is a schematic diagram of a surface layer wiring of a PCB board according to an embodiment of the present disclosure.
Figure 11:
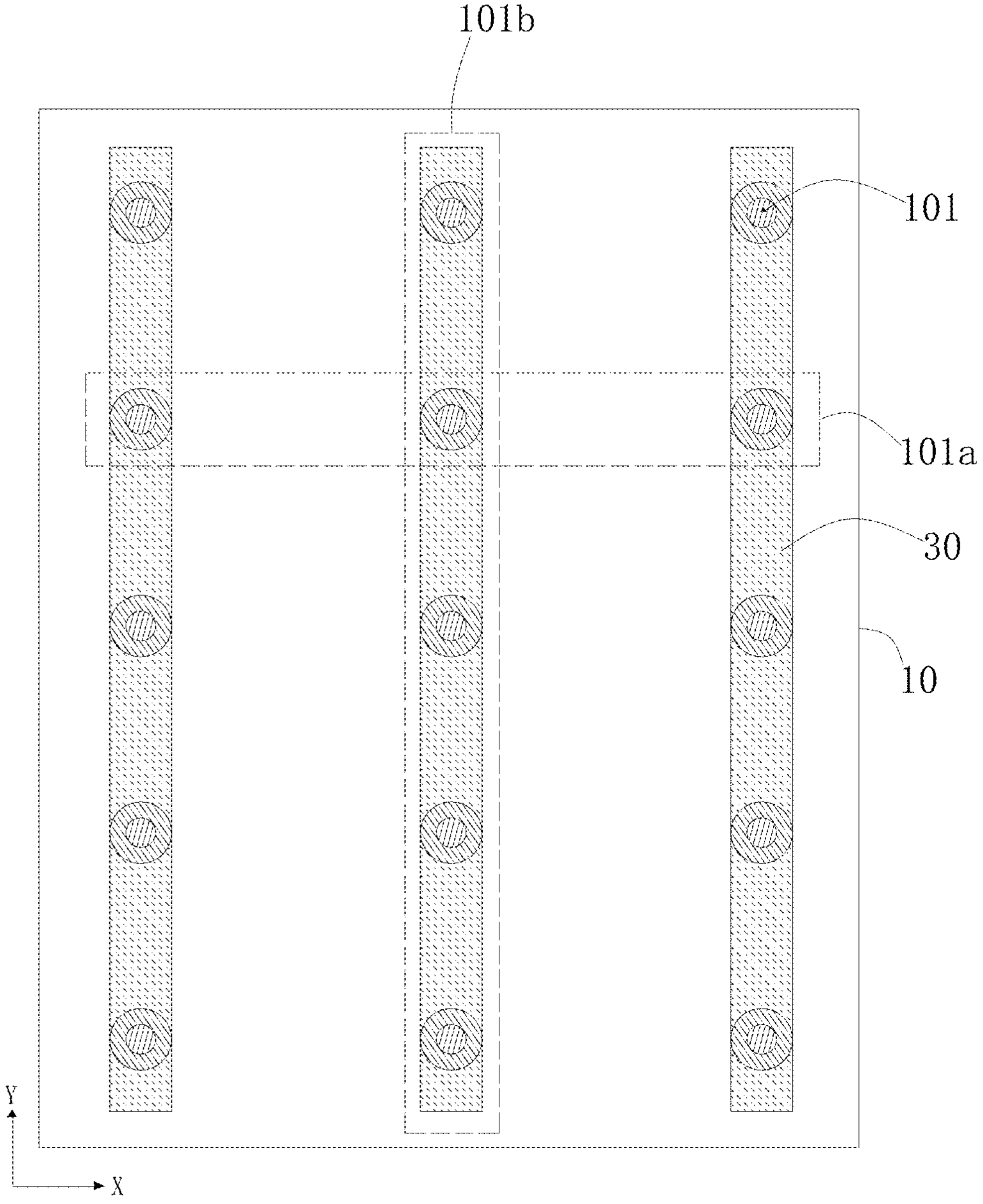
FIG. 11 is a schematic diagram of an inner layer wiring of a PCB board according to an embodiment of the present disclosure.

Referring to FIGS. 8, 9 and 10, FIG. 8 is a schematic diagram of a wiring layout of a PCB board according to an embodiment of the present invention, FIG. 9 is a schematic diagram of a surface layer wiring of a PCB board according to an embodiment of the present invention, and FIG. 10 is a schematic diagram of an inner layer wiring of a PCB board according to an embodiment of the present invention.

An embodiment of the present application further provides an LED panel structure including a PCB board 10 for mounting a plurality of LEDs 201. The PCB board 10 including M data lines 40, N scanning lines 30, and a plurality of terminal pairs 110. The data lines 40 extend in the first direction, M≥4 and is an integer, and the plurality of data lines 40 are arranged at intervals in the second direction. The scanning lines 30 extend in the second direction, N≥2 and is an integer, and the plurality of scanning lines 30 are arranged at intervals in the first direction. The second direction intersects the first direction, for example, the first direction and the second direction are at an angle of 90° to each other, the first direction is an X-axis direction, and the second direction is a Y-axis direction. A plurality of terminal pairs 110 are located on the surface layer of the PCB board 10, and are arranged in an array in a first direction and a second direction to form M rows of terminal pairs 110 and N columns of terminal pairs 110. The rows formed by the plurality of terminal pairs 110 extend in the first direction, the M rows of terminal pairs are arranged at intervals in the second direction, the columns formed by the plurality of terminal pairs 110 extend in the second direction, and the N columns of terminal pairs 110 are arranged at intervals in the first direction. Each terminal pair 110 includes a first terminal 111 and a second terminal 112, the first terminals 111 of all terminal pairs 110 in an i-th row of terminal pairs 110 are connected to an i-th data line 40, and the second terminals 112 of all terminal pairs 110 in a j-th column of terminal pairs 110 are connected to a j-th scanning line 30. In the thickness direction of the PCB board 10, the orthographic projections of the i-th data line 40 and the (i+1)-th data line 40 are located between the orthographic projections of the i-th row of terminal pairs 110 and the (i+1)-th row of terminal pairs 110.

It may be appreciated that the PCB board 10 is provided with the M data lines 40, the N scanning lines 30, and the plurality of terminal pairs 110. Each terminal pair 110 includes the first terminal 111 to be connected to the non-common-electrode terminal 2012 of the LED 201, and the second terminal 112 to be connected to the common-electrode terminal 2011 of the LED 201. The first terminal 111 is connected to the data line 40, and the first terminal 111 is disposed at a side of the data line 40. Two data lines 40 of the M data lines 40 are disposed between the i-th row of terminal pairs 110 and the (i+1)-th row of terminal pairs 110, the two data lines 40 are the i-th data line 40 and the (i+1)-th data line 40 respectively, the first terminals 111 of all the terminal pairs 110 in the i-th row of terminal pairs 110 are disposed at a side of the two data lines 40 close to the i-th data line 40, and the first terminals 111 of all the terminal pairs 110 in the (i+1)-th row of terminal pairs 110 are disposed at a side of the two data lines 40 close to the (i+1)-th data line 40. The first terminals 111 for the i-th data line 40 and the first terminals 111 for the (i+1)-th data line 40 are disposed back-to-back, the first terminals 111 for the (i−1)-th data line 40 is provided opposite to the first terminals 111 for the i-th data line 40, and two rows of terminal pairs 110 are provided between the (i−1)-th data line 40 and the i-th data line 40.

In some embodiments, as shown in FIG. 9, M data lines 40 are located on the surface layer of the PCB board 10, N scanning lines 30 are located on the inner or bottom layer of the PCB board 10, and second terminals 112 of all terminal pairs 110 in the j-th column of terminal pairs 110 are connected to the j-th scanning line 30 through the via holes 101.

The terminal pairs 110 are provided on the surface layer of the PCB board 10, and the second terminal 112 of the terminal pair 110 is connected to the scanning line 30 across the layer. Therefore, a plurality of via holes 101 are provided on the PCB board 10, and the second terminals 112 are connected to the scanning lines 30 through the via holes 101. The processing of the terminal pair 110 is simple, and the connection operation of the terminal pair 110 with the LED 201 is facilitated.

In some embodiments, in the j-th column of terminal pairs 110, the second terminal 112 of the terminal pair 110 in the i-th row and the second terminal 112 of the terminal pair 110 in the (i−1)-th row are connected to the same via hole 101.

In the same column of terminal pairs 110, the second terminals 112 of the two terminal pairs 110 in the adjacent rows are connected to the same via hole 101. The PCB board 10 is provided with the plurality of via holes 101, and the plurality of via holes 101 are arranged in an array along the first direction and the second direction to form n rows of via holes 101 and N columns of via holes 101. The number of the rows of the via holes 101 is half of the number of the rows of the terminal pairs 110, and the number of the columns of the via holes 101 is the same as the number of the columns of the terminal pairs 110. The second terminals 112 of the j-th column of terminal pairs 110 are connected to the via holes 101 in the j-th column, terminal pairs 110 in the j-th column are located next to the j-th column of via holes 101, and one row of via holes 101 is provided between the (i−1)-th data line 40 and the i-th data line 40. Compared with the case where a second terminal 112 of one terminal pair 110 is connected to one via hole 101, the number of the via holes 101 is reduced, the yield of the PCB board 10 is improved, the waste of materials is reduced, and the manufacturing cost of the PCB board 10 is reduced.

In other embodiments, in the j-th column of terminal pairs 110, the second terminals 112 of the adjacent plurality of terminal pairs 110 are connected to the same via hole 101, for example, the second terminals 112 of the adjacent three terminal pairs 110 are connected to the same via hole 101.

In other embodiments, in the j-th column of terminal pairs 110, the second terminal 112 of one terminal pair 110 is connected to one via hole 101.

In some embodiments, the spacing between the i-th row of terminal pairs 110 and the (i+1)-th row of terminal pairs 110 is divided into three equal parts by the i-th data line 40 and the (i+1)-th data line 40.

It may be appreciated that the first terminals 111 for the i-th data line 40 and the first terminals 111 for the (i+1)-th data line 40 are provided back-to-back, the first terminals 111 of all the terminal pairs 110 in the i-th row of terminal pairs 110 are provided at a side of the i-th data line 40 away from the (i+1)-th data line 40, and the first terminals 111 of all the terminal pairs 110 in the (i+1)-th row of terminal pairs 110 are provided at a side of the (i+1)-th data line 40 away from the i-th data line 40. In the j-th column of terminal pairs 110, the spacing between the first terminal 111 of the terminal pair 110 in the (i+1)-th row and the first terminal 111 of the terminal pair 110 in the (i+1)-th row is divided into three equal parts by the i-th data line 40 and the (i+1)-th data line 40, that is, a distance between the i-th row of terminal pairs 110 and the (i+1)-th data line 40, a distance between the (i+1)-th data line 40 and the (i+1)-th row of terminal pairs 110 are equal to each other.

Referring to FIG. 9, a smallest unit of the PCB board 10 includes four data lines 40, two scanning lines 30, eight terminal pairs 110, and four via holes 101. The data lines 40 extend in the X-axis direction, the four data lines 40 are arranged at intervals in the Y-axis direction, the scanning lines 30 extend in the Y-axis direction, the two scanning lines 30 are arranged at intervals in the X-axis direction, and the eight terminal pairs 110 are arranged in an array along the X-axis direction and the Y-axis direction to form four rows of terminal pairs 110 and two columns of terminal pairs 110. All first terminals 111 of the i-th row of terminal pairs 110 are connected to the i-th row data line 40. A second row data line 40 and a third row data line 40 are located between the second row of terminal pairs 110 and the third row of terminal pairs 110. For example, all first terminals 111 of the second row of terminal pairs 110 are located at a side of the second row data line 40 away from the third row data line 40 and connected to the second row data line 40, and all first terminals 111 of the third row of terminal pairs 110 are located at a side of the third row data line 40 away from the second row data line 40 and connected to the third row data line 40. The j-th column of terminal pairs 110 is located at a side of the j-th column scanning line 30, and all the second terminals 112 in the j-th column of terminal pairs 110 are connected to the j-th column scanning line 30. The four via holes 101 are arranged in and array along the X-axis direction and the Y-axis direction to form two rows of via holes 101 and two columns of via holes 101, the j-th column of via holes 101 are located on the j-th column scanning line 30, the second terminals 112 of the j-th column of terminal pairs 110 are connected to the j-th column of via holes 101, the second terminals 112 of the first row of terminal pairs 110 and the second terminals 112 of the second row of terminal pairs 110 are connected to the first row of via holes 101, and the second terminals 112 of the third row of terminal pairs 110 and the second terminals 112 of the fourth row of terminal pairs 110 are connected to the second row of via holes 101.

In the specific implementation, each of the above units or structures may be implemented as a separate object, or may be implemented in any combination as the same object or several objects. For a specific implementation of each of the above units or structures, reference may be made to the foregoing embodiments, and details are not described herein.

The LED panel structure according to an embodiment of the present disclosure have been described in detail. The principles and embodiments of the present disclosure have been described with reference to specific embodiments, and the description of the above embodiments is merely intended to aid in the understanding of the method of the present disclosure and its core idea. At the same time, changes may be made by those skilled in the art to both the specific implementations and the scope of application in accordance with the teachings of the present disclosure. In view of the foregoing, the content of the present specification should not be construed as limiting the disclosure.

What is claimed is:

1. An LED panel structure, comprising:

a PCB board provided with a plurality of data lines, a plurality of scanning lines and a plurality of via holes, wherein the data lines and the scanning lines are respectively located at different layers of the PCB board, the data lines extend in a first direction, and the scanning lines extend in a second direction; and a plurality of LEDs arranged on a surface layer of the PCB board, wherein the plurality of LEDs are arranged in an array along the first direction and the second direction to form a plurality of LED rows and a plurality of LED columns, the LED rows extend in the first direction, the LED columns extend in the second direction, each of the LED columns includes a plurality of LED groups, each of the LED groups includes two adjacent LEDs, a plurality of adjacent LEDs are sequentially arranged in the second direction to form a plurality of light-emitting pixels, and each of the LEDs includes a common-electrode terminal and a non-common-electrode terminal, wherein common-electrode terminals of each of the LEDs in the first column or in the last column of the plurality of LED columns extending in the second direction are electrically connected to each other on the surface layer of the PCB board to form one scanning line extending in the second direction on the surface layer of the PCB board, wherein common-electrode terminals of the LEDs in at least one of the plurality of columns extending in the second direction are electrically connected to each other through one or more corresponding via holes of the via holes, to form one scanning line extending in the second direction on a different layer of the PCB board than the surface layer; and non-common-electrode terminals of all LEDs in each of the LED rows are electrically connected to each other on the surface layer of the PCB board to form one data line extending in the first direction on the surface layer of the PCB board, and two data lines are arranged between adjacent LED groups.

2. The LED panel structure according to claim 1, wherein: the plurality of via holes are arranged in an array in the first direction and the second direction to form a plurality of via hole rows and a plurality of via hole columns, the via hole rows extend in the first direction, the via hole columns extend in the second direction, and two data lines are provided between adjacent via hole rows.

3. The LED panel structure according to claim 1, wherein the number of the via holes is less than the number of the LEDs.

4. The LED panel structure according to claim 1, wherein common-electrode terminals of the two LEDs in each of the LED groups are connected to the same via hole.

5. The LED panel structure according to claim 4, wherein the scanning lines are provided on an inner layer or a bottom layer of the PCB board, and/or the data lines are provided on a surface layer of the PCB board.

6. The LED panel structure according to claim 5, wherein a surface of the PCB board is provided with a plurality of connection patterns, each of the connection patterns are configured to connect common-electrode terminals of two LEDs of a corresponding LED group, and each of the connection patterns is connected to a corresponding scanning line of the scanning lines through a corresponding via hole of the via holes.

7. The LED panel structure according to claim 1, wherein a spacing between adjacent LEDs in each of the LED columns is the same.

8. The LED panel structure according to claim 1, wherein all the LEDs in each of the LED rows are LEDs with the same light-emitting color.

9. The LED panel structure according to claim 1, wherein each of the light-emitting pixels comprises a red LED, a blue LED and a green LED.

10. The LED panel structure according to claim 1, wherein the LEDs are encapsulated on the PCB board in a chip-on-board manner or a surface mount device manner.

11. An LED panel structure, comprising:

a PCB board for mounting a plurality of LEDs, wherein the PCB board comprising:

M data lines extending in a first direction, wherein $M \geq 4$ and is an integer;

N scanning lines extending in a second direction, wherein $N \geq 2$ and is an integer; and a plurality of terminal pairs located on a surface layer of the PCB board, wherein the plurality of terminal pairs are arranged in an array along the first direction and the second direction to form M rows of terminal pairs and N columns of terminal pairs, each of the terminal pairs includes a first terminal and a second terminal, first terminals of all terminal pairs in an i-th row of terminal pairs are connected to an i-th data line, and second terminals of all terminal pairs in a j-th column of terminal pairs are connected to a j-th scanning line, and wherein in a thickness direction of the PCB board, orthographic projections of the i-th data line and an (i+1)-th data line are located between orthographic projections of the i-th row of terminal pairs and an (i+1)-th row of terminal pairs.

12. The LED panel structure according to claim 11, wherein the data lines are located on a surface layer of the PCB board, the scanning lines are located on an inner layer or a bottom layer of the PCB board, and the second terminals of all the terminal pairs in the j-th column of terminal pairs are connected to the j-th scanning lines through via holes.

13. The LED panel structure according to claim 12, wherein the number of the via holes is less than the number of the terminal pairs.

14. The LED panel structure according to claim 12, wherein in the j-th column of terminal pairs, a second terminal of a terminal pair in the i-th row and a second terminal of a terminal pair in the (i−1)-th row are connected to the same via hole.

15. The LED panel structure according to claim 14, wherein a surface of the PCB board is provided with a plurality of connection patterns, each of the connection patterns are configured to connect the second terminal of the terminal pair in the i-th row and the second terminal of the terminal pair in the (i−1)-th row, and each of the connection patterns is connected to a corresponding scanning line of the scanning lines through a corresponding via hole of the via holes.

16. The LED panel structure according to claim 11, wherein the LEDs comprise a plurality of red LEDs, a plurality of blue LEDs, and a plurality of green LEDs.

17. The LED panel structure according to claim 11, wherein the LEDs are encapsulated on the PCB board in a chip-on-board manner or a surface mount device manner.

* * * * *